United States Patent [19]

Ohkuma

[11] Patent Number: 5,053,721

[45] Date of Patent: Oct. 1, 1991

[54] HIGH FIDELITY REGENERATIVE AMPLIFIER WITH PHASE CORRECTION CIRCUIT

[76] Inventor: Saburoh Ohkuma, 2-20-8, Nan-yodai Hachioji-shi, Tokyo, Japan

[21] Appl. No.: 450,741

[22] Filed: Dec. 14, 1989

[30] Foreign Application Priority Data

Oct. 18, 1988 [JP] Japan ................. 63-262143

[51] Int. Cl.$^5$ .............................. H03F 3/91
[52] U.S. Cl. ..................... 330/302; 330/304
[58] Field of Search ............... 307/510, 511; 328/55, 328/155; 330/107, 149, 291, 302, 304, 306; 333/18

[56] References Cited

U.S. PATENT DOCUMENTS 3,283,258  11/1966  Haynes ........................ 330/304

Primary Examiner—Steven Mottola
Attorney, Agent, or Firm—Koda and Androlia

[57] ABSTRACT

A high fidelity regenerative amplifier with a phase correction circuit has a frequency characteristic which is flat over as a wide frequency range as possible and a phase characteristic suitable for a characteristic of the sound field in which regenerated sound is reproduced. In order to achieve such characteristics, an amplifier which amplifies regenerated sound with high fidelity is preceded by a phase correction circuit connected thereto to correct the phase characteristic of the amplifier over a wide frequency range. Such phase correction in accordance with the sound field characteristic can reproduce sound very near to natural sound regardless of the sound field.

1 Claim, 5 Drawing Sheets

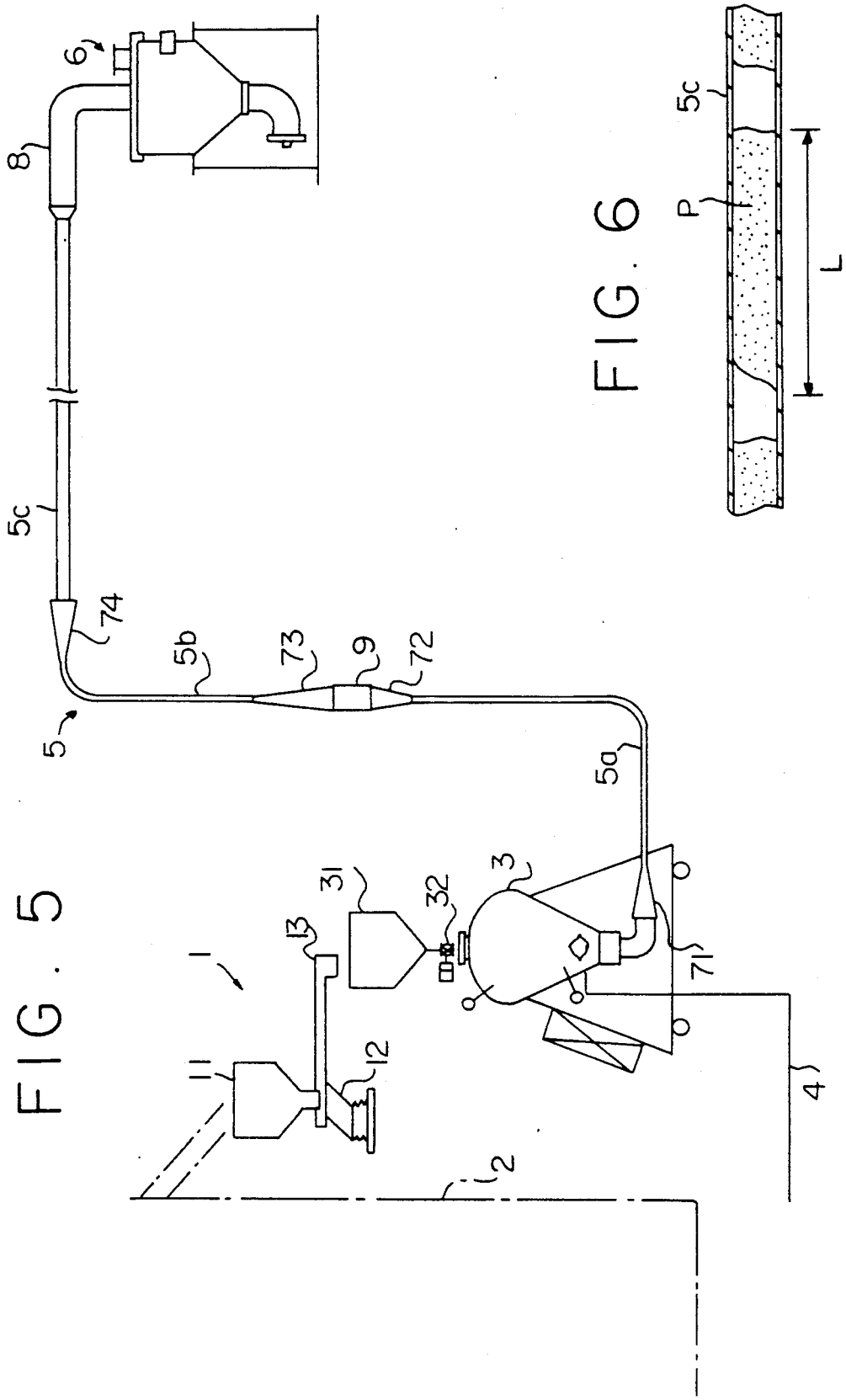

ND PHASE CORRECTION CIRCUIT

HIGH FIDELITY REGENERATIVE AMPLIFIER WITH PHASE CORRECTION CIRCUIT

BACKGROUND OF THE INVENTION

1. Field of the Invention

The present invention relates to a high fidelity regenerative amplifier with a phase correction circuit which can correct a frequency characteristic and a phase characteristic in accordance with a sound field characteristic to obtain regenerated sound extremely near to natural sound specifically in a place where an acoustic condition is not so good, for example, such as in a room of an automobile.

2. Description of the Prior Art

Recently, an amplifier named a so-called audio amplifier capable of regenerating sound with high fidelity is generally used.

The audio amplifier is required to regenerate sound with high fidelity and accordingly a frequency characteristic thereof is adapted to be flat over as a wide frequency range as possible.

A frequency characteristic of a common audio amplifier is substantially flat from about 30 Hz to about 10 KHz while the frequency characteristic is lower with decrease or increase of the frequency in a frequency range other than the above frequency range. On the other hand, there is a phase characteristic that a phase is gradually delayed with increase of the frequency.

In an audio amplifier, heretofore, the quality of regenerated sound has been improved. The improvement of the sound quality is achieved by an equalizer or the like to attain a flat frequency characteristic in a sound field. However, it has been found by a recent experiment that it is desirable that a phase characteristic is flat over the all frequency range in addition to the flat frequency characteristic in order to realize higher quality sound in a general sound field. Heretofore, an improvement in an amplifier for the phase characteristic which is corrected to be flat over the all frequency range is not quite made. Accordingly, a conventional audio amplifier has a limit to improvement of the quality of regenerated sound. Further, since the conventional audio amplifier has a different phase for each frequency, an oscillation may occur in a ultra-low or ultra-high frequency range in the case where the quality of sound is improved on the basis of a conventional idea. Even in this point, there is a limit to improvement of the quality of regenerated sound.

Even in a conventional audio amplifier provided in a vehicle, an equalizer capable of correcting the sound field characteristic in a room of the vehicle is provided in an amplifier so that music can be heard in a relatively good condition even in the room of the vehicle where an acoustic condition is not so good. However, in such a conventional equalizer, since the frequency characteristic can be made flat but a phase characteristic is not taken into consideration, there is also a limit to improvement of the quality of regenerated sound for the above-mentioned reason.

More particularly, an equalizer is generally configured by a combination of different filter circuits having various characteristics. In a conventional equalizer, when a single sound of a sine wave is employed and its frequency is gradually increased or decreased so that a phase characteristic of the equalizer is measured by a measuring apparatus, there can be obtained a phase characteristic having no variation over substantially all frequency range apparently. However, since the phase characteristic is obtained as a result of a combination of phase characteristics of a low pass filter, a band pass filter and a high pass filter constituting the equalizer, a phase distortion occurs due to a phase difference in a frequency range in which phases of each of the filters are overlapped to thereby cause deterioration and impurity of the quality of sound and indefiniteness of orientation of the acoustic image. The phase difference is particularly large at an overlap point of the frequency characteristic curves of the filters, that is, in the vicinity of a dip point. This is caused by the fact that the equalizer includes a feedback circuit.

As described above, the improvement of the sound quality in the prior art resides in the realization of the flat frequency characteristic. However, in order to reproduce the higher quality sound, the phase distortion can not be neglected as described above. The phase of regenerated sound is an important improvement item since it is an important element to the orientation of the acoustic image when excellent sound in the psychological aspect which is not measured by any measuring apparatus, directly speaking, natural sound, such as sound having presence or transparency, or sound which does not give fatigue even if listening to the sound for a long time is pursued.

SUMMARY OF THE INVENTION

The present invention has been made to solve the above problems in the prior art and an object of the present invention is to provide a high fidelity regenerative amplifier with a phase correction circuit having a flat phase characteristic over a wide frequency range and a flat output level characteristic over a wide frequency range.

In order to achieve the above object, in the present invention, an amplifier which amplifies regenerated sound with high fidelity is preceded by a phase correction circuit which corrects a phase characteristic of the amplifier over a wide frequency range.

Accordingly, the frequency characteristic and the phase characteristic are flat over a wide frequency range and regeneration of very natural sound can be attained in a place where an acoustic condition is not so good, such as, for example in a room of a vehicle.

Further, in the present invention, in order to achieve a phase characteristic suited to the sound field characteristic, connected to the preceding stage of an amplifier which amplifies regenerated sound with high fidelity is a phase correction circuit which corrects the phase characteristic of the amplifier over a wide frequency range. Further, connected to the preceding stage of the phase correction circuit is an equalizer including a medium frequency and high frequency correction circuits having a characteristic that a phase of an input aural signal advances as a frequency of the aural signal is high in a higher frequency range than the vicinity of 1 KHz, a circuit constant which advances a phase of the frequency from about 1 KHz to 5 KHz relatively in order to attain far and near feeling, and a resistor and condenser connected in parallel or series, and a low frequency correction circuit having a characteristic that a phase of the input aural signal is delayed as a frequency of the aural signal is low, a circuit constant having a reverse characteristic to a peak of a resonance frequency of the sound field to be regenerated, and a resistor and a condenser connected in parallel or series, the medium, high and low frequency correction circuits being connected one another.

Accordingly, the regenerated sound can be brought close to more natural sound even in the sound field having a peculiar characteristic in which the sound field characteristic is not flat. Further, the phase distortion can be removed.

DETAILED DESCRIPTION OF THE INVENTION

Figure 1:
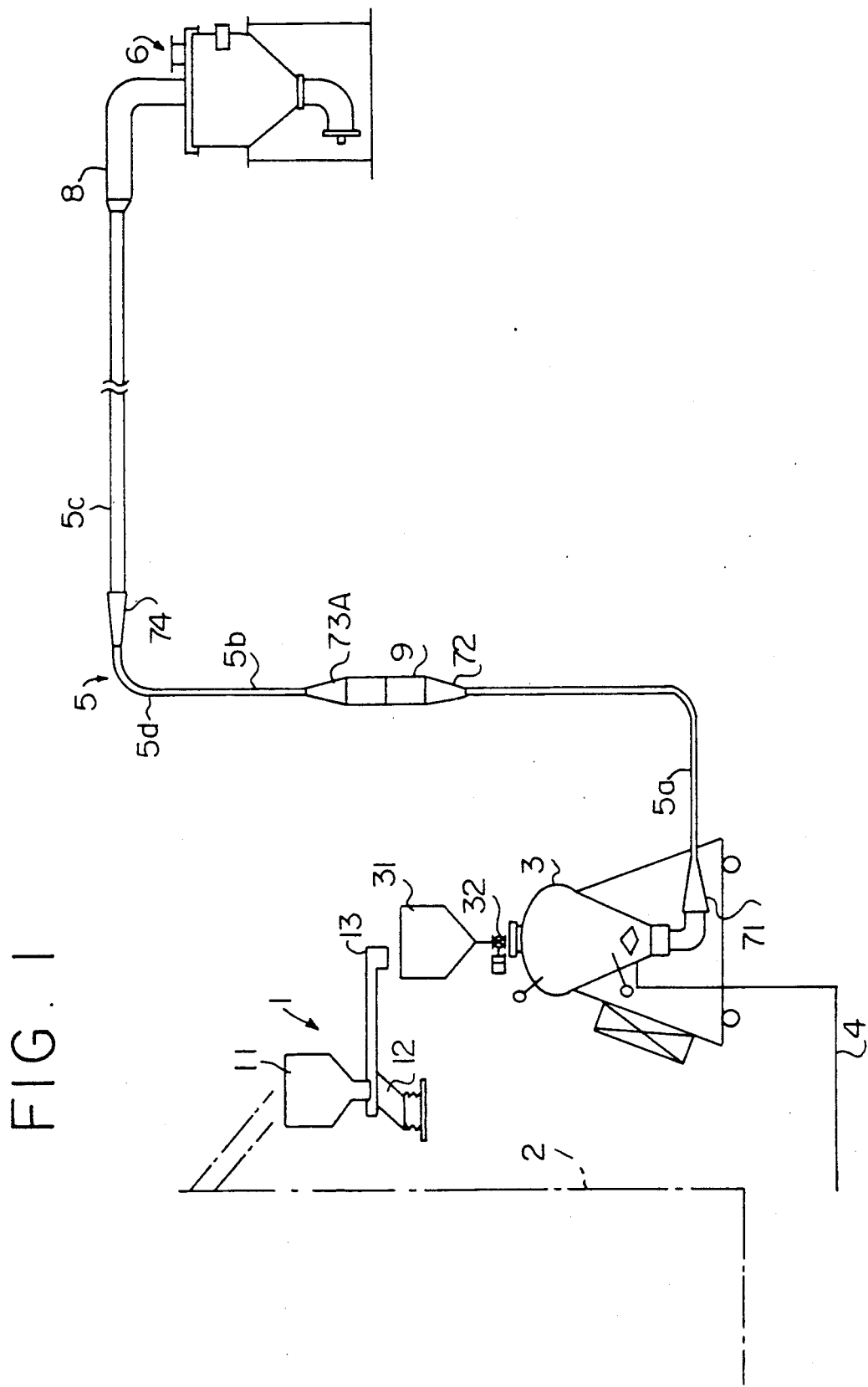
FIG. 1 is a schematic circuit diagram of a phase correction circuit used with a high fidelity regenerative amplifier according to the present invention.

FIG. 1 schematically illustrates only a phase correction circuit used with a high fidelity regenerative amplifier according to the present invention.

The circuit shown in FIG. 1 is configured by transistors and includes two phase correction circuits 1 connected in series.

In the phase correction circuit, a parallel circuit of a condenser C1 and a resistor R1 connected to an emitter of a transistor 10 constitutes a high pass filter, and a series circuit of a condenser C2 and a resistor R2 connected to a collector of the transistor 10 constitutes a low pass filter. Naturally, constants of circuit elements constituting the filters are decided so that the phase characteristic of the amplifier can be compensated.

A second circuit constructed in the same manner as the above first circuit is connected at its output in series and an output of the second circuit is amplified by a transistor 20 to be supplied to an amplifier.

Accordingly, the phase characteristic of aural signal outputted from the amplifier is flat over a very wide frequency range and the frequency characteristic thereof is also flat over a very wide frequency range.

Figure 2:
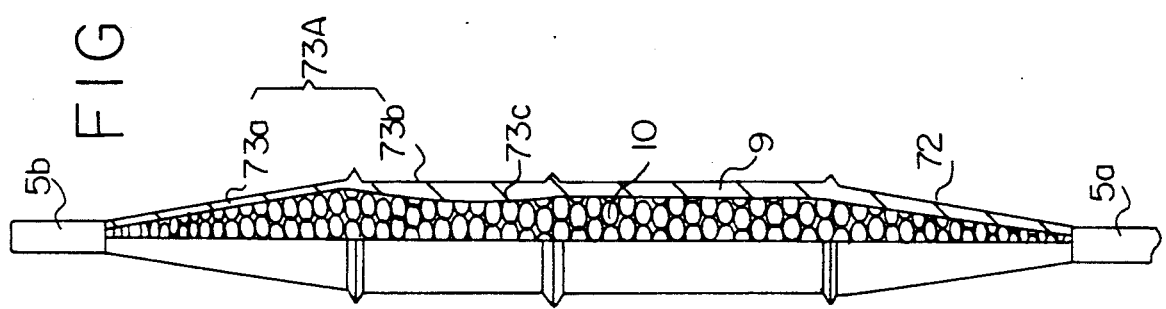
FIG. 2 is a schematic circuit diagram of another phase correction circuit used with a high fidelity regenerative amplifier according to the present invention.

FIG. 2 schematically illustrates another phase correction circuit having another circuit configuration. This circuit is also configured by transistors.

In this circuit, a resistor R3 and a condenser C3 constitute a high pass filter, and a condenser C4 and a resistor R4 constitute a low pass filter. Aural signal passing through these filters is amplified by transistors 25 and 30 and is supplied to an amplifier. Constants of circuit elements constituting the filters are decided so that the phase characteristic of the amplifier can be compensated.

Figure 3:
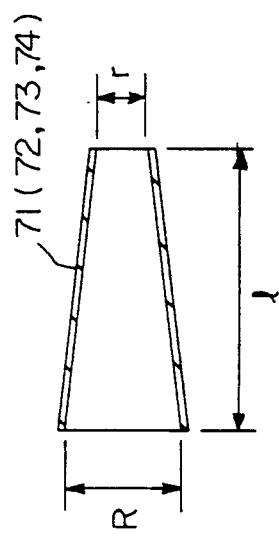
FIG. 3 is a characteristic diagram of the high fidelity regenerative amplifier with the phase correction circuit shown in FIG. 2.

Accordingly, the phase characteristic of aural signal supplied to the amplifier is substantially flat over a very wide frequency range and the frequency characteristic is also flat over a very wide frequency range. The characteristics of the circuit shown in FIG. 2 are shown in FIG. 3. As apparent from FIG. 3, the level is substantially flat in a range from 100 Hz to 10 KHz and the phase slowly changes from a lagging phase to a leading phase in accordance with increase of the frequency while establishing a frequency of 1 KHz as a boundary.

Figure 4:
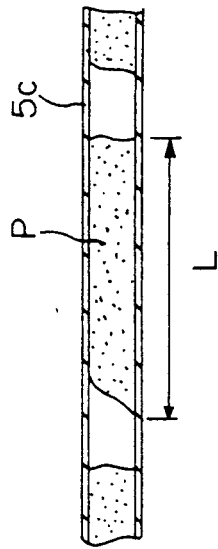
FIGS. 4 and 5 are schematic circuit diagrams of other phase correction circuits used with a high fidelity regenerative amplifier.
Figure 9A:
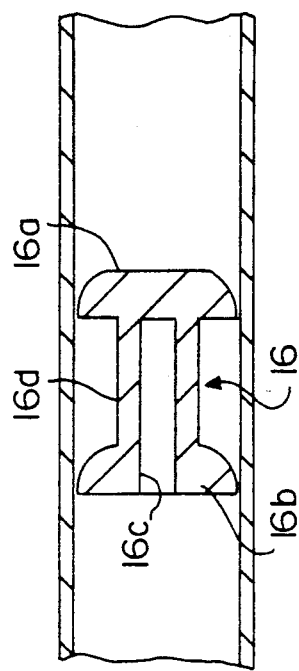
FIG. 9 is a characteristic diagram of the equalizer shown in FIGS. 7 and 8.
Figure 9B:
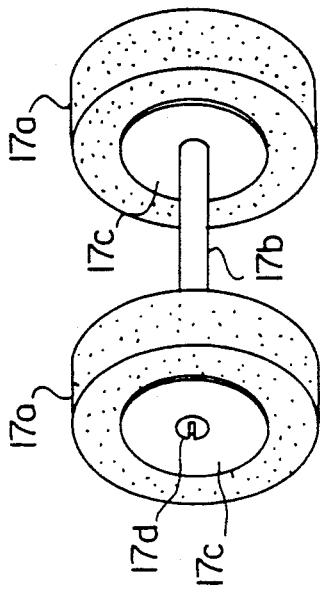
Figure 5:
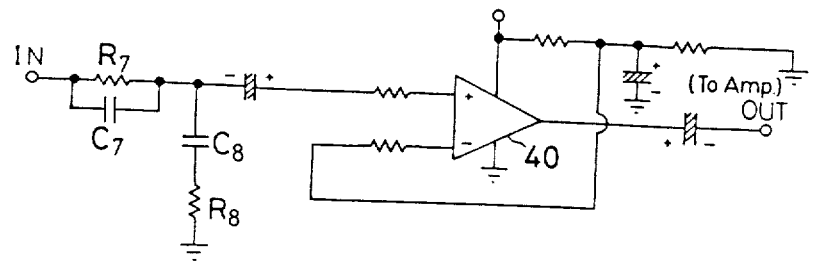

FIGS. 4 and 5 are phase correction circuits each constructed by an operational amplifier.

In the circuits, a resistor R5 and a condenser C5, and a resistor R7 and a condenser C7 constitute high pass filters, respectively, and a condenser C6 and a resistor R6, and a condenser C8 and a resistor R8 constitute low pass filters, respectively. Aural signal passing through each of the filters is amplified by an operational amplifier 35 or 40, respectively, to be supplied to an amplifier. In this case, constants of circuit elements constituting the filters are also decided so that the phase characteristic of the amplifier can be compensated.

Accordingly, the phase characteristic of aural signal outputted from the amplifier is flat over a very wide frequency range and the frequency characteristic thereof is also flat over a very wide frequency range.

Figure 6:
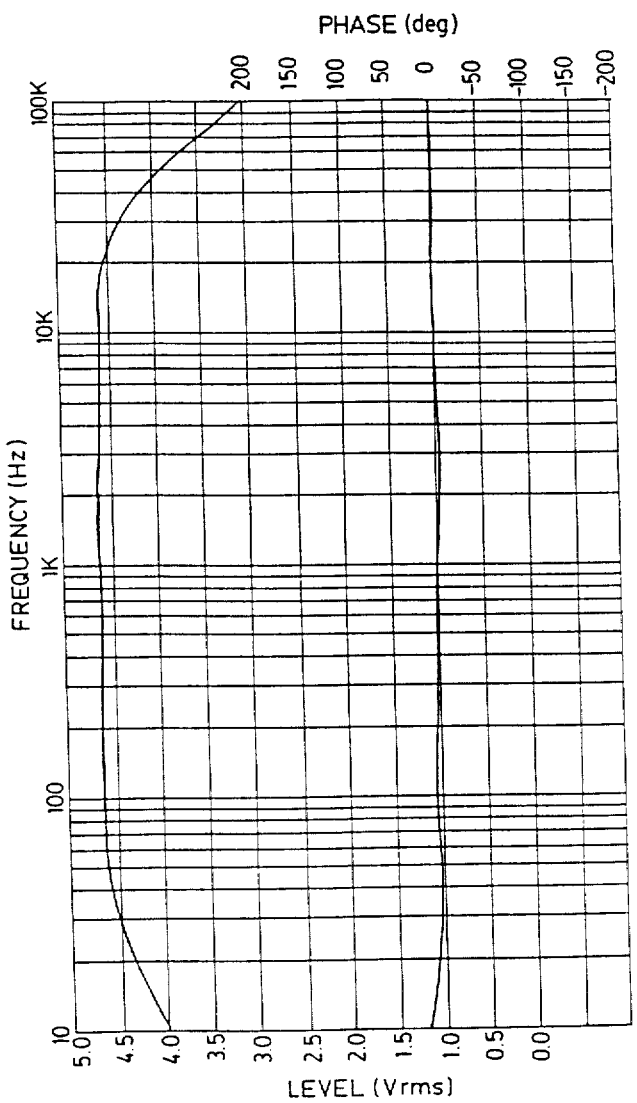
FIG. 6 is a diagram showing a phase and frequency characteristics of a high fidelity regenerative amplifier with a phase correction circuit according to the present invention.

FIG. 6 shows the phase characteristic and the frequency characteristic of the amplifier connected to the output of the above-mentioned phase correction circuit.

As apparent from the figure, the phase characteristic is substantially flat over a wide frequency range and the frequency characteristic is also flat over a fairly wide frequency range. Accordingly, the phase distortion is very small. Although measurement by a measuring apparatus is not possible, since the exemplified various phase correction circuits are open-loop circuits constructed very simply, the circuits are characterized in that there is no sound shift even if sound of a percussion instrument producing sound immediately and having a large dynamic range is regenerated.

Figure 7:
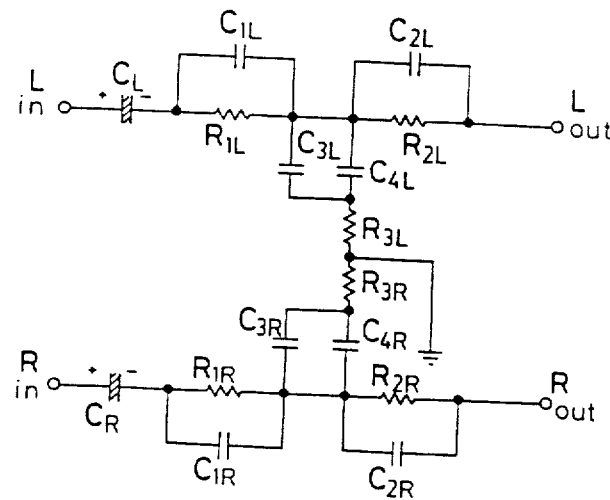
Figure 8:
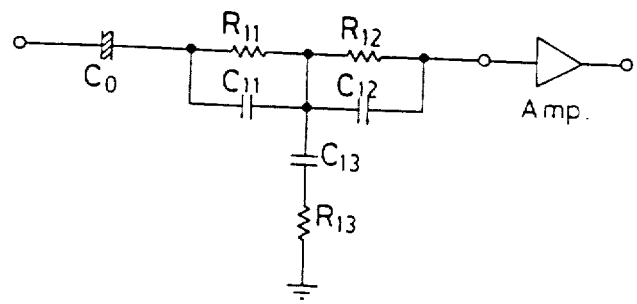

Further, FIG. 7 is a schematic circuit diagram of an equalizer connected to an input of an amplifier.

As shown in FIG. 7, the circuit is constructed by resistors and condensers. Parallel circuits of a condenser $C_{1L}$ and a resistor $R_{1L}$, and a condenser $C_{2L}$ and a resistor $R_{2L}$ constitute a left high pass filter, and parallel circuits of a condenser $C_{1R}$ and a resistor $R_{1R}$, and a condenser $C_{2R}$ and a resistor $R_{2R}$ constitute a right high pass filter. Condensers $C_{3L}$ and $C_{4L}$ and a resistor $R_{3L}$ constitute a left low pass filter, and condensers $C_{3R}$ and $C_{4R}$ and a resistor $R_{3R}$ constitute a right low pass filter. These high pass filters and low pass filters are connected each other and each of one ends of the low pass filters is connected to ground.

Figure 8:
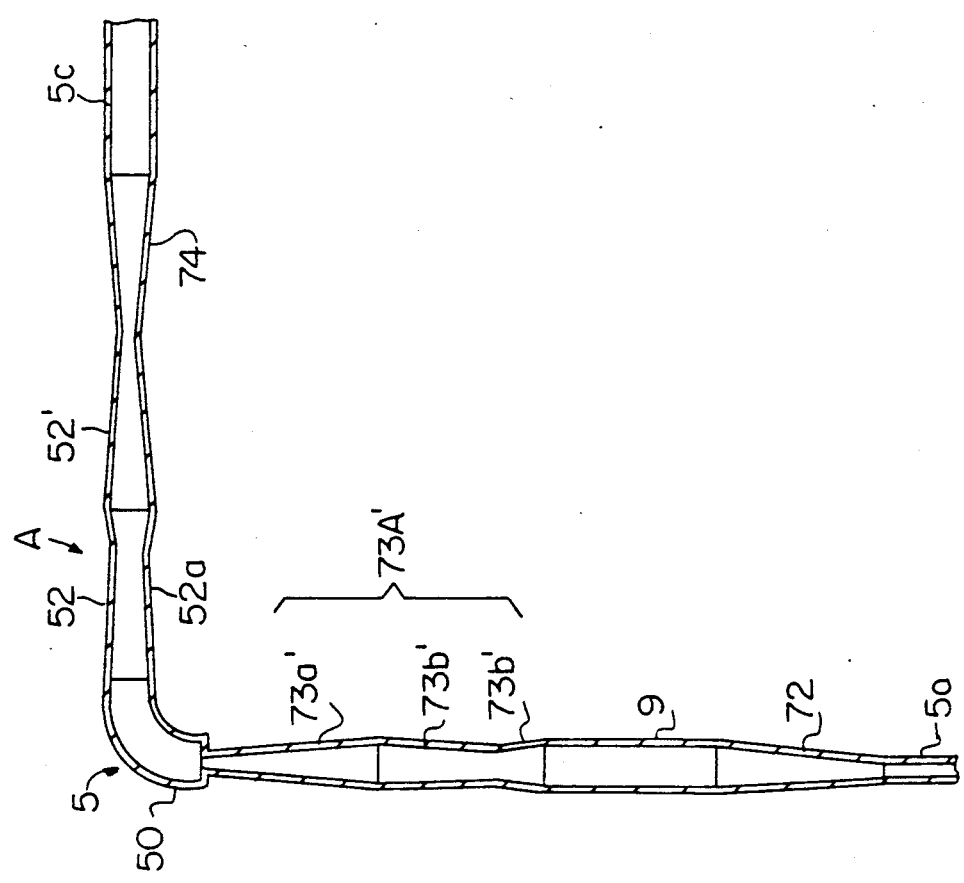
FIG. 8 is a schematic circuit diagram showing only one channel of the equalizer shown in FIG. 7.
Figure 7A:
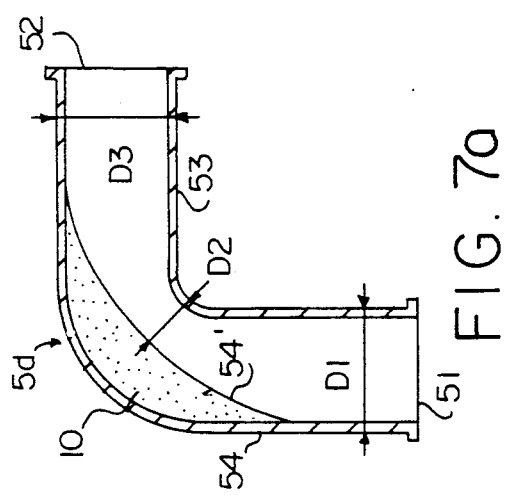
FIG. 7 is a schematic circuit diagram of an equalizer according to the present invention.
Figure 7B:
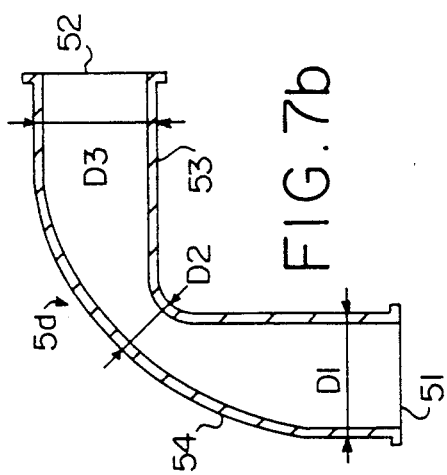
Figure 10:
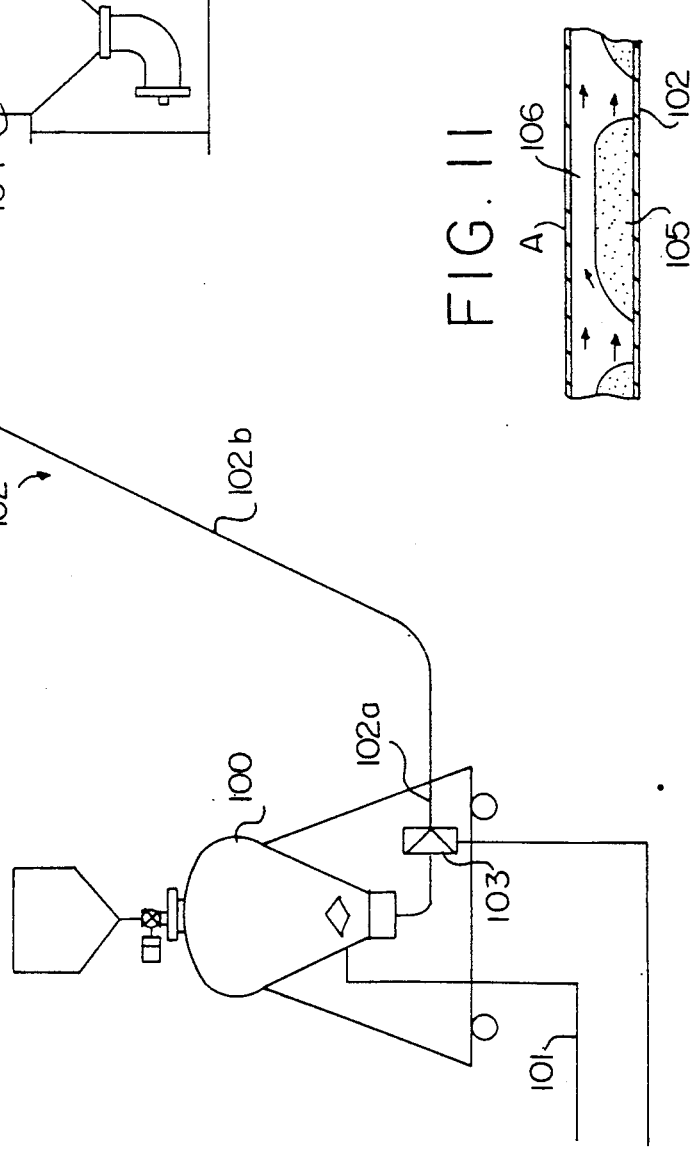
FIG. 10A is an actual circuit diagram used in a characteristic test of an equalizer according to the present invention.
FIG. 10B is a characteristic diagram of the circuit shown in FIG. 10A.
Figure 11:
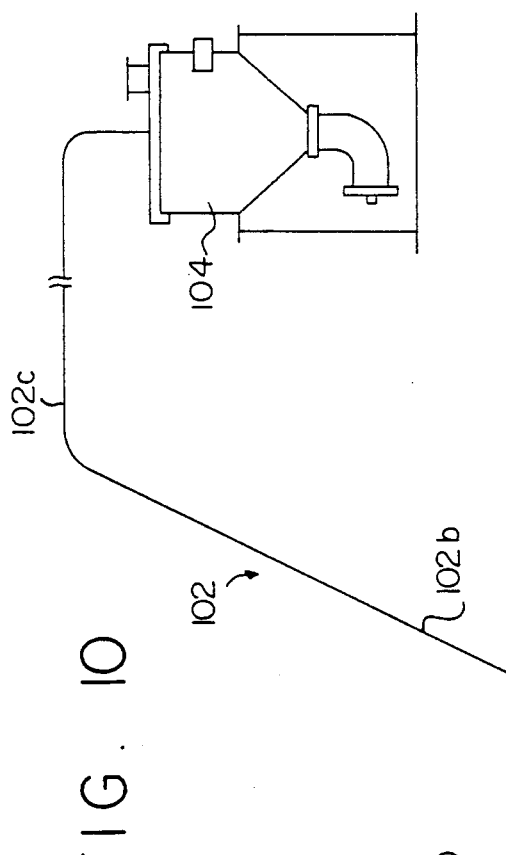
FIG. 11A is another actual circuit diagram used in a characteristic test of an equalizer according to the present invention.
FIG. 11B is a characteristic diagram of the circuit shown in FIG. 11A.
Figure 1:
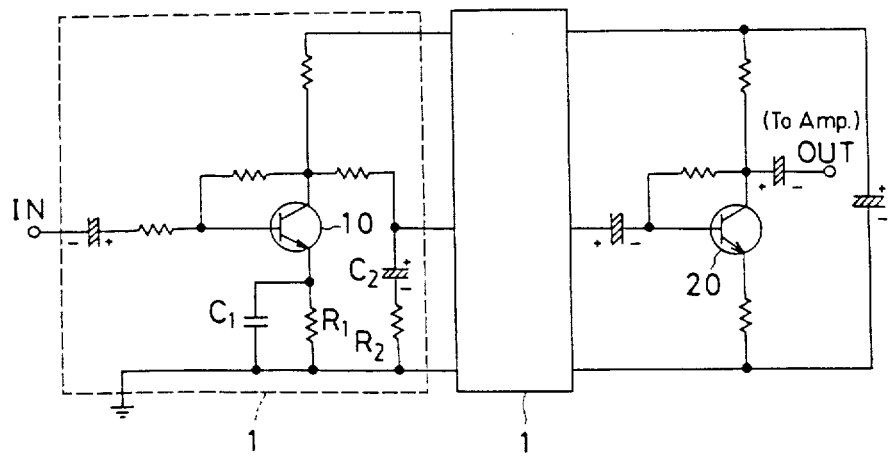
Figure 2:
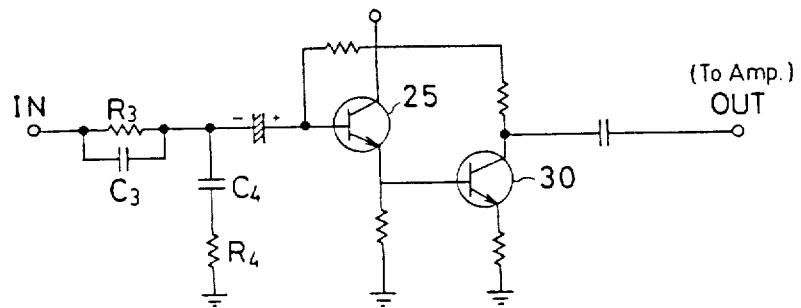
Figure 3:
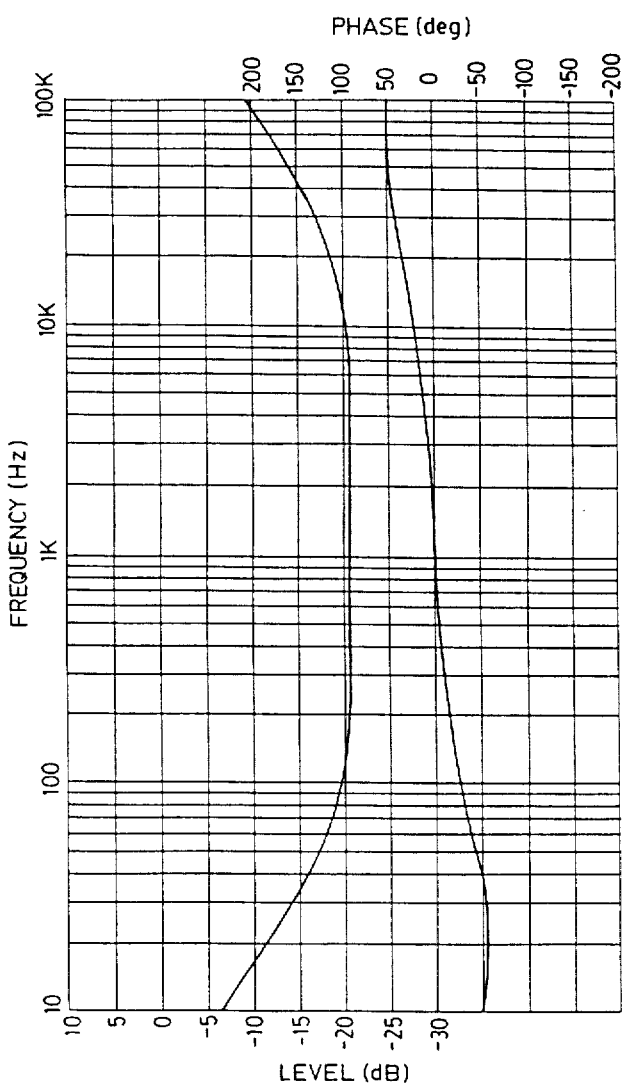
Figure 4:
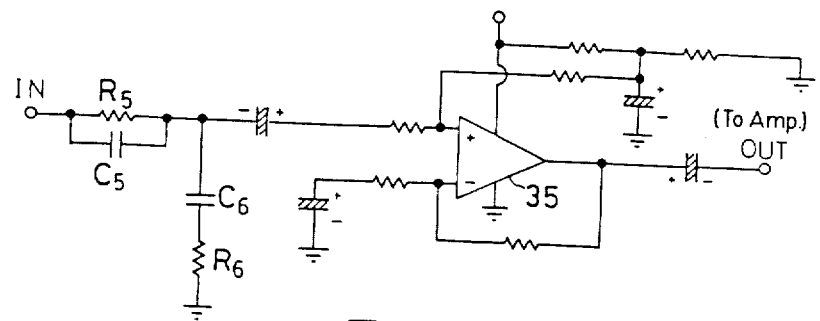

Only one side of the circuit of FIG. 7 is equivalently shown as in FIG. 8.

In the equalizer of this embodiment, the decision of constants of elements constituting the equalizer is very important.

Figure 9:
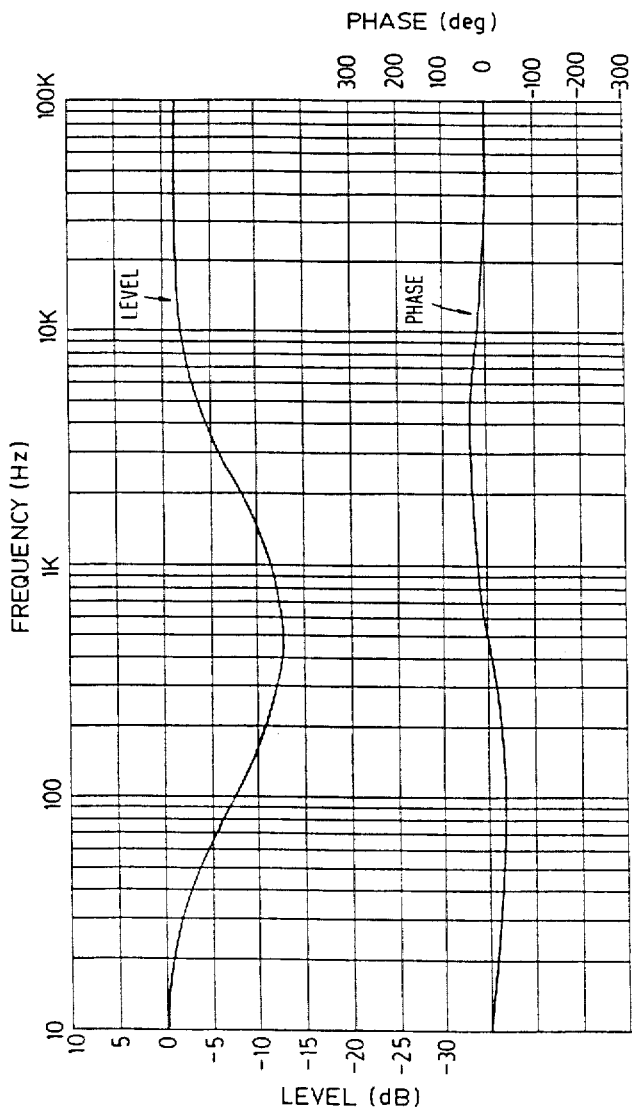

More particularly, it is ideal that the dip point described above is decided to substantially match a resonance frequency of a room or a room of a vehicle which is a sound field. However, since the equalizer of the embodiment has the phase characteristic and the frequency characteristic which are changed very smoothly, very severe setting is not necessary. The phase characteristic in the frequency range less than the dip point is set to tend to lag and the level in the frequency range less than the dip point is set to be increased as the frequency is decreased. With the setting, the orientation feeling in the right and left direction is improved so that sound is given solemn feeling. In the frequency range larger than the frequency at the dip point and less than 5 KHz, the phase characteristic is set to tend to lead and the level of the frequency characteristic is set to be increased. With the setting, the orientation feeling in the front and rear direction is improved. Since the frequency range from 5 KHz to the vicinity of 12 KHz is a frequency range in which abundance of musicality is affected, the phase characteristic is set to tend to lead and the frequency characteristic is set to be increased in the same manner as above. The frequency range larger than 12 KHz is an important frequency range for improvement of atmosphere and more natural sound and is a frequency range necessary for removing psychological sense of oppression as if a head were suppressed. Further, in the vicinity of the dip point, the characteristic is set to a reverse characteristic to a peak of a resonance frequency of the regenerated sound field, such as, for example a room of a vehicle. Accordingly, it is necessary to set the constants so that the characteristics required for each of the frequency ranges are satisfied. FIG. 9 shows an example of the characteristics, which satisfy the characteristics required for each of the frequency ranges.

Figure 10B:
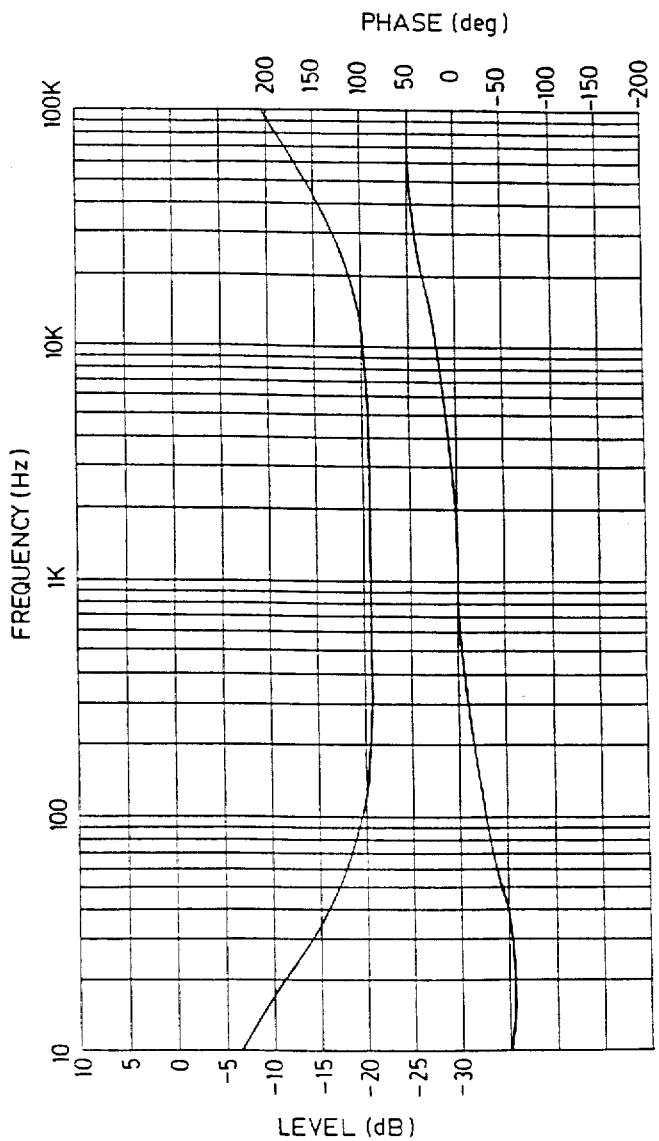
Figure 10A:
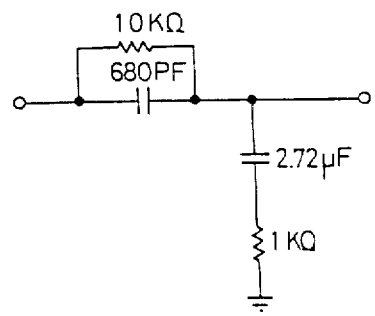

FIG. 10A shows a circuit including a high pass filter of a resistor R having a resistance value 10 KΩ and a condenser C having a capacitance 680 PF and a low pass filter of a resistor R having a resistance value 1 KΩ and a condenser C having a capacitance 2.72 μF, connected each other.

The frequency characteristic and the phase characteristic of this circuit are shown in FIG. 10B and satisfy the characteristics required for each of the frequency ranges.

More particularly, in the frequency characteristic, when 1000 Hz is set as a reference, the frequency is gradually decreased from a lowest frequency to to about 200 Hz and is gradually increased in the frequency larger than about 10 KHz, while in the phase characteristic, when 1000 Hz is set as a reference, the phase lags in the frequency lower than 1000 Hz with decrease of the frequency and the phase leads in the frequency larger than 1000 Hz with increase of the frequency.

Figure 11A:
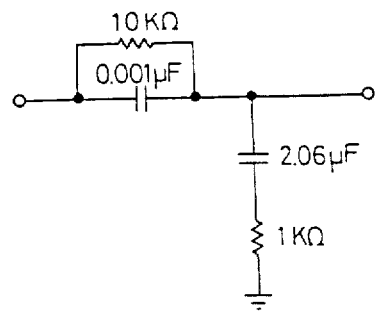

FIG. 11A shows a circuit according to another embodiment having different circuit constants, the circuit including a high pass filter of a resistor R having a resistance value 10 KΩ and a condenser C having a capacitance 0.001 μF and a low pass filter of a resistor R having a resistance value 1 KΩ and a condenser C having a capacitance 2.06 μF, connected each other.

Figure 11B:
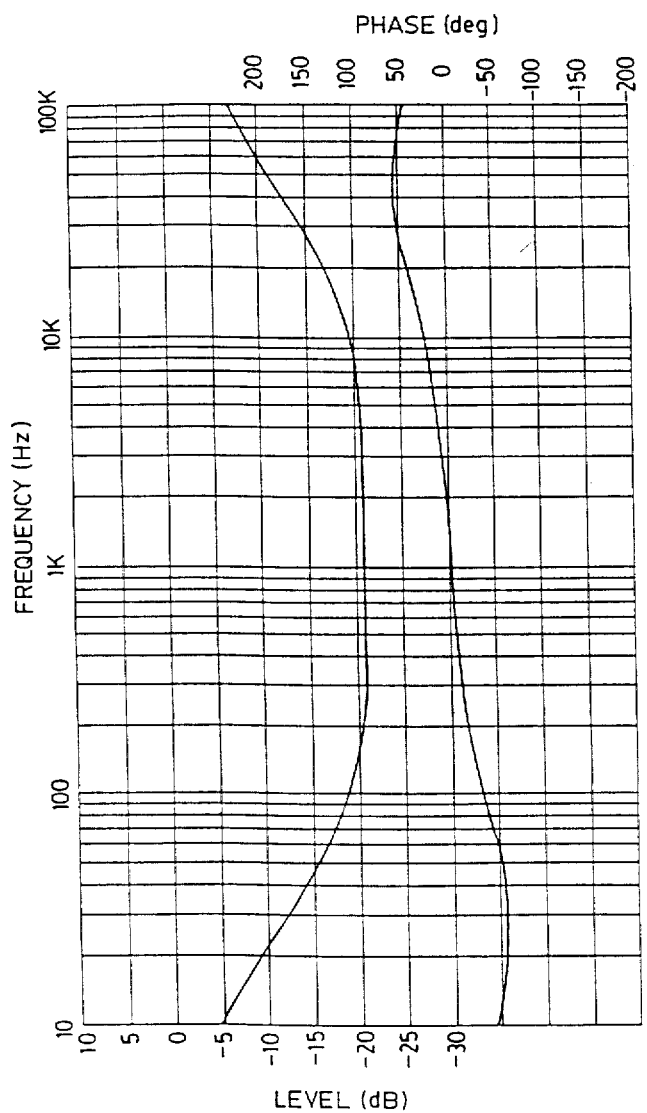

The frequency characteristic and the phase characteristic of this circuit are the substantially same as those shown in FIG. 10B. That is, as shown in FIG. 11B, in the frequency characteristic, when 1000 Hz is set as a reference, the frequency is gradually decreased from a lowest frequency to about 200 Hz and is gradually increased in the frequency larger than about 10 KHz, while in the phase characteristic, when 1000 Hz is set as a reference, the phase lags in the frequency lower than 1000 Hz with decrease of the frequency and the phase leads in the frequency larger than 1000 Hz with increase of the frequency.

When the amplifier with the phase correction circuit according to the present invention is actually operated, features in the psychological aspect which can not be measured by a measuring apparatus are as follows:

(a) Since the phase characteristic is flat over a wide frequency range, the phase distortion is small. For example, even if sounds having the same frequency and different sound quality is regenerated, the orientation feeling of the acoustic image is improved extremely as compared with the conventional method.

More particularly, even if a violin and a piano produce sounds having the same frequency at the same time, the mutual positional relation (front or rear and right or left) of the violin and the piano is defined exactly.

(b) Sound is very clear. This is a matter of course since the phase distortion is decreased by the improved phase characteristic and the frequency characteristic is also improved. Specifically, sound produced by drawing or rubbing a string can be heard well.

(c) Sound having the presence is produced. More particularly, there is a feeling of the immediate vicinity near the speaker or player. This is considered to be the synergism by improvement of the orientation feeling. More particularly speaking of the presence, near sound source is heard to be positioned in front of a loudspeaker and far sound source is heard to be positioned at the back of the loudspeaker. Further, the azimuth angle of the sound source in the right and left direction is realized so that the sound source is wider or narrower than the azimuth angle of the loudspeaker. Thus, it is near to an image of the regeneration of original sound field rather than an image of the regeneration of original sound.

(d) It is sound which does not give fatigue even if listening to the sound for a long time. This is considered to be achieved by the fact that the phase characteristic and the frequency characteristic are flat over a wide frequency range so that sound is brought close to natural sound. This psychological effect is specifically important for an amplifier which regenerates music in a very narrow space as in an audio system for a car.

(e) Even when listening to music in a narrow space, it feels as if listening to the sound in a large hall and there is no oppression as if a head is suppressed. This is also considered to be achieved by the fact that the orientation feeling is improved and a position of the acoustic sound is clear.

(f) By controlling volume by a volume controller, it is heard so that the whole of the acoustic image is near and far. More particularly, when the volume is decreased, it feels as if the musical performance is made far, while when the volume is increased, it feels as if the musical performance is made near.

(g) So-called vibration sound generated in a saturation of an output of an amplifier is reduced or quite removed.

As described above, in the present embodiment, there have been described the phase correction circuits. each configured by transistors or an operation amplifier, respectively. However, the phase correction circuit is not limited to such circuits and it is a matter of course that the phase correction circuit may be any circuit configuration as far as the phase characteristic of the amplifier can be compensated. Although there has been exemplified the equalizer including filters each composed of one resistor and one condenser, the equalizer is not limited thereto and naturally the equalizer may be configured by a complicated circuit which equivalently constitutes the circuit of the embodiment. The amplifier with the phase correction circuit according to the present invention can be naturally applied to various uses such as an audio amplifier used in a room, an audio amplifier mounted in an automobile and the like.

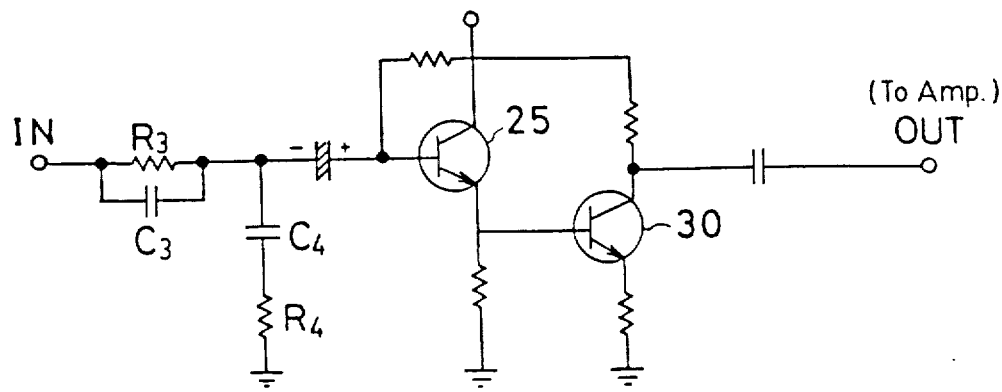

What is claimed is:

1. A high fidelity regenerative amplifier circuit comprising an amplifier for amplifying sound with high fidelity, a phase correction circuit connected to an input of said amplifier to correct a phase characteristic of said amplifier over a wide frequency range, and an equalizer connected to an input of said phase correction circuit and including medium frequency and high frequency correction circuits having a characteristic such that a phase of an input aural signal advances as a frequency of the aural signal is high in a higher frequency range than the vicinity of 1 KHz, a circuit constant which advances a phase of the frequency from about 1 KHz to 5 KHz relatively in order to attain far and near feeling, and a resistor and a condenser connected in parallel or series, and a low frequency correction circuit having a characteristic such that a phase of the input aural signal is delayed as a frequency of the aural signal is low in a lower frequency range than about 1 KHz, a circuit constant having a reverse characteristic to a peak of a resonance frequency of the sound field to be regenerated, and a resistor and a condenser connected in parallel or series, said medium, high and low frequency correction circuits being connected to one another.

* * * * *

UNITED STATES PATENT AND TRADEMARK OFFICE
CERTIFICATE OF CORRECTION

PATENT NO. : 5,053,721

DATED : October 1, 1991

INVENTOR(S) : Saburoh Ohkuma

It is certified that error appears in the above-identified patent and that said Letters Patent is hereby corrected as shown below:

The title page should be deleted to appear as per attached title page.

The sheets of drawings should be deleted, to be replaced with figures 1 - 11B.

Signed and Sealed this

Eighth Day of June, 1993

*Attest:*

MICHAEL K. KIRK

*Attesting Officer*   Acting Commissioner of Patents and Trademarks

United States Patent

Ohkuma

Patent Number: 5,053,721
Date of Patent: Oct. 1, 1991

[54] HIGH FIDELITY REGENERATIVE AMPLIFIER WITH PHASE CORRECTION CIRCUIT

[76] Inventor: Saburoh Ohkuma, 2-20-8, Nan-yodai Hachioji-shi, Tokyo, Japan

[21] Appl. No.: 450,741

[22] Filed: Dec. 14, 1989

[30] Foreign Application Priority Data

Oct. 18, 1988 [JP] Japan ............................ 63-262143

[51] Int. Cl.⁵ .................................... H03F 3/91
[52] U.S. Cl. ............................... 330/302; 330/304
[58] Field of Search .................. 307/510, 511; 328/55, 328/155; 330/107, 149, 291, 302, 304, 306; 333/18

[56] References Cited

U.S. PATENT DOCUMENTS 3,283,258 11/1966 Haynes ........................... 330/304

Primary Examiner—Steven Mottola
Attorney, Agent, or Firm—Koda and Androlia

[57] ABSTRACT

A high fidelity regenerative amplifier with a phase correction circuit has a frequency characteristic which is flat over as a wide frequency range as possible and a phase characteristic suitable for a characteristic of the sound field in which regenerated sound is reproduced. In order to achieve such characteristics, an amplifier which amplifies regenerated sound with high fidelity is preceded by a phase correction circuit connected thereto to correct the phase characteristic of the amplifier over a wide frequency range. Such phase correction in accordance with the sound field characteristic can reproduce sound very near to natural sound regardless of the sound field.

1 Claim, 5 Drawing Sheets